United States Patent
Ma et al.

(10) Patent No.: US 10,490,506 B2
(45) Date of Patent: Nov. 26, 2019

(54) PACKAGED CHIP AND SIGNAL TRANSMISSION METHOD BASED ON PACKAGED CHIP

(71) Applicant: Huawei Technologies Co., Ltd., Shenzhen (CN)

(72) Inventors: Chih Chiang Ma, Hsinchu (TW); Jyh Rong Lin, Hsinchu (TW); Xiaodong Zhang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/858,302

(22) Filed: Dec. 29, 2017

(65) Prior Publication Data
US 2018/0190590 A1    Jul. 5, 2018

(30) Foreign Application Priority Data

Dec. 30, 2016 (CN) .......................... 2016 1 1264772

(51) Int. Cl.
*H01L 23/538* (2006.01)
*H01L 23/31* (2006.01)
(Continued)

(52) U.S. Cl.
CPC ...... *H01L 23/5386* (2013.01); *H01L 23/3128* (2013.01); *H01L 23/49811* (2013.01);
(Continued)

(58) Field of Classification Search
CPC combination set(s) only.
See application file for complete search history.

(56) References Cited

U.S. PATENT DOCUMENTS

| 7,004,198 B1 | 2/2006 | Okandan et al. |
| 7,659,145 B2 | 2/2010 | Do et al. |

(Continued)

FOREIGN PATENT DOCUMENTS

| CN | 201667330 U | 12/2010 |
| CN | 104037134 A | 9/2014 |

(Continued)

OTHER PUBLICATIONS

Machine Translation and Abstract of Korean Publication No. KR101624855, May 27, 2016, 16 pages.

(Continued)

*Primary Examiner* — Mamadou L Diallo
(74) *Attorney, Agent, or Firm* — Conley Rose, P.C.

(57) ABSTRACT

A packaged chip, including a package structure, a redistribution structure, and a carrier, where the package structure includes a first chip and a second chip adjacent to the first chip. The redistribution structure is configured to electrically connect the first chip and the carrier, and is configured to electrically connect the second chip and the carrier. The redistribution structure includes a main body made of an insulating material and a bump solder array welded to a lower surface of the main body. A metal redistribution wire group and a metal interconnection wire group that has a curve or bend design are disposed in the main body. An upper surface of the main body of the redistribution structure adheres to a lower surface of the first chip and a lower surface of the second chip. The redistribution structure is welded to an upper surface of the carrier.

18 Claims, 5 Drawing Sheets

(51) Int. Cl.
*H01L 23/00* (2006.01)
*H01L 23/66* (2006.01)
*H01L 23/498* (2006.01)
*H01L 21/56* (2006.01)

(52) U.S. Cl.
CPC ...... *H01L 23/5384* (2013.01); *H01L 23/5389* (2013.01); *H01L 23/66* (2013.01); *H01L 24/19* (2013.01); *H01L 24/20* (2013.01); *H01L 24/24* (2013.01); *H01L 24/25* (2013.01); *H01L 24/96* (2013.01); *H01L 21/563* (2013.01); *H01L 21/568* (2013.01); *H01L 2223/6611* (2013.01); *H01L 2224/04105* (2013.01); *H01L 2224/12105* (2013.01); *H01L 2224/16227* (2013.01); *H01L 2224/24011* (2013.01); *H01L 2224/24137* (2013.01); *H01L 2224/25171* (2013.01); *H01L 2224/25175* (2013.01); *H01L 2224/25177* (2013.01); *H01L 2224/32225* (2013.01); *H01L 2224/73204* (2013.01); *H01L 2224/81203* (2013.01); *H01L 2224/81815* (2013.01); *H01L 2224/92125* (2013.01); *H01L 2924/14* (2013.01); *H01L 2924/141* (2013.01); *H01L 2924/143* (2013.01); *H01L 2924/15311* (2013.01); *H01L 2924/351* (2013.01)

(56) References Cited

U.S. PATENT DOCUMENTS

| | | | |
|---|---|---|---|
| 7,807,512 | B2 | 10/2010 | Lee et al. |
| 7,838,975 | B2 | 11/2010 | Chen |
| 8,093,722 | B2 | 1/2012 | Chen et al. |
| 8,310,051 | B2 | 11/2012 | Chen et al. |
| 8,372,689 | B2 | 2/2013 | Lee et al. |
| 8,389,333 | B2 | 3/2013 | Camacho |
| 8,624,374 | B2 | 1/2014 | Ding et al. |
| 8,624,376 | B1 | 1/2014 | Chen et al. |
| 9,484,307 | B2 | 11/2016 | Tsai et al. |
| 9,859,245 | B1* | 1/2018 | Chen ............ H01L 24/16 |
| 2009/0273075 | A1 | 11/2009 | Meyer-Berg |
| 2011/0031619 | A1* | 2/2011 | Chen ............ H01L 21/563 257/738 |
| 2012/0161332 | A1 | 6/2012 | Chua et al. |
| 2012/0299191 | A1 | 11/2012 | Camacho |
| 2013/0105991 | A1 | 5/2013 | Gan et al. |
| 2013/0182402 | A1 | 7/2013 | Chen et al. |
| 2013/0187270 | A1 | 7/2013 | Yu et al. |
| 2013/0200528 | A1 | 8/2013 | Lin et al. |
| 2013/0234322 | A1 | 9/2013 | Pendse |
| 2013/0249101 | A1 | 9/2013 | Lin et al. |
| 2013/0256836 | A1 | 10/2013 | Hsiao et al. |
| 2013/0256883 | A1 | 10/2013 | Meyer et al. |
| 2014/0001645 | A1 | 1/2014 | Lin et al. |
| 2014/0015131 | A1 | 1/2014 | Meyer et al. |
| 2014/0252655 | A1 | 9/2014 | Tran et al. |
| 2015/0357307 | A1* | 12/2015 | Fu ............ H01L 23/481 257/774 |
| 2016/0037623 | A1 | 2/2016 | Fjelstad |
| 2016/0240497 | A1* | 8/2016 | Chen ............ H01L 25/0655 |
| 2016/0256133 | A1 | 9/2016 | Dekker et al. |
| 2016/0316559 | A1 | 10/2016 | Jung et al. |
| 2016/0379935 | A1 | 12/2016 | Shih |
| 2018/0025973 | A1* | 1/2018 | Fu ............ H01L 23/528 |

FOREIGN PATENT DOCUMENTS

| | | |
|---|---|---|
| CN | 204029805 U | 12/2014 |
| CN | 105489516 A | 4/2016 |
| CN | 105849890 A | 8/2016 |
| CN | 105895598 A | 8/2016 |
| CN | 106067455 A | 11/2016 |
| CN | 106684066 A | 5/2017 |
| EP | 3255668 A1 | 12/2017 |
| KR | 101624855 B1 | 5/2016 |
| WO | 2016025478 A1 | 2/2016 |
| WO | 2016165074 A1 | 10/2016 |

OTHER PUBLICATIONS

Foreign Communication From A Counterpart Application, Chinese Application No. 201611264772.1, Chinese Office Action dated Jul. 13, 2018, 6 pages.
Foreign Communication From A Counterpart Application, European Application No. 17210862.3, Extended European Search Report dated May 30, 2018, 8 pages.
Machine Translation and Abstract of Chinese Publication No. CN105489516, Apr. 13, 2016, 17 pages.
Machine Translation and Abstract of Chinese Publication No. CN106684066, May 17, 2017, 18 pages.
Machine Translation and Abstract of Chinese Publication No. CN201667330, Dec. 8, 2010, 8 pages.
Foreign Communication From A Counterpart Application, PCT Application No. PCT/CN2017/114772, International Search Report dated Mar. 7, 2018, 6 pages.
Foreign Communication From A Counterpart Application, PCT Application No. PCT/CN2017/114772, Written Opinion dated Mar. 7, 2018, 5 pages.
Machine Translation and Abstract of Chinese Publication No. CN204029805, Dec. 17, 2014, 10 pages.
Foreign Communication From a Counterpart Application, Chinese Application No. 201611264772.1, Chinese Office Action dated Aug. 15, 2019, 6 pages.

* cited by examiner

PACKAGED CHIP AND SIGNAL TRANSMISSION METHOD BASED ON PACKAGED CHIP

CROSS-REFERENCE TO RELATED APPLICATION

This application claims priority to Chinese Patent Application No. 201611264772.1 filed on Dec. 30, 2016, which is hereby incorporated by reference in its entirety.

TECHNICAL FIELD

The present disclosure relates to the field of electronic packaging technologies, and in particular, to a packaged chip and a signal transmission method based on a packaged chip.

BACKGROUND

Driven by a demand for a consumer electronic product, an electronic product, such as a smartphone or a tablet computer, is becoming thinner and smaller with lower costs. Therefore, a higher requirement is imposed on a semiconductor process and a chip, and one packaged chip is required to load more integrated circuits. Based on industrial and commercial manufacturers' requirements, integrated circuits applied to the packaged chip are mounted in a wide variety of base chips (for example, dies). As the process develops, based on a higher functional requirement, a packaging manner in which two or more dies are packaged together attracts more attention in the industry. At present, a 2.5D fan-out package (FOP) is used for a high-end product. The 2.5D FOP means that a fan-out redistribution layer (RDL) implements high-density interconnection to connect dies that have different functions and sizes.

As a new advanced packaging method introduced in recent years, an FOP initially allows batch manufacturing by combining a wafer-level packaging and manufacturing technology and a conventional packaging advantage of a single die in order to significantly reduce packaging costs for an electronic product. A typical FOP process is as follows. First, mount a die on a wafer carrier, debond the wafer carrier after plastic packaging, then manufacture an RDL and perform bumping, and finally perform die sawing, a reliability test, and product assembly.

Multiple dies packaged in one packaged chip do not independently operate, and data exchange and signal transmission requirements exist between different dies. In a 2.5D FOP structure, to implement signal transmission between two adjacent dies, an interconnection distribution layer between the two dies needs to span a molding compound fan-out area between the two dies. At present, a part that is of the interconnection distribution layer design and that spans the two dies is a shortest straight line design. Referring to FIG. 3. FIG. 3 is a top view of die pin interconnection using a metal interconnection module. However, in a 2.5D FOP process, packaging materials, such as a plastic packaging material, a chip, and a carrier, that have different coefficients of thermal expansion are used. If coefficients of thermal expansion do not match between the used materials, stress generated by temperature cycling cannot be extended, and the interconnection distribution layer between the two adjacent dies may bend for several millimeters or tens of millimeters and may even break. Consequently, reliability of transmission between the two adjacent dies is affected.

SUMMARY

Embodiments of the present disclosure provide a packaged chip and a signal transmission method based on a packaged chip in order to improve reliability of transmission between two adjacent chips when a relatively short signal path is ensured.

A first aspect of the embodiments of the present disclosure provides a packaged chip, where the packaged chip includes a package structure, a redistribution structure, and a carrier. The package structure includes a first chip and a second chip adjacent to the first chip. The redistribution structure is configured to electrically connect the first chip and the carrier and electrically connect the second chip and the carrier, and the redistribution structure includes a main body made of an insulating material and a bump solder array welded to a lower surface of the main body, a metal redistribution wire group is disposed in the main body, the metal redistribution wire group is electrically connected to the first chip and the second chip and the carrier using the bump solder array. A metal interconnection wire group having a curve design is disposed in the main body, and the metal interconnection wire group is electrically connected to the first chip and the second chip. The carrier is configured to secure the redistribution structure, and a solder ball, a pad, or a connector is disposed on a lower surface of the carrier, and an upper surface of the main body of the redistribution structure adheres to a lower surface of the first chip and a lower surface of the second chip, and the bump solder array of the redistribution structure is welded to an upper surface of the carrier.

In the first aspect of the embodiments of the present disclosure, adjacent chips are connected by the metal interconnection wire group to ensure a relatively short signal path. The metal interconnection wire group having the curve design is used to prevent the metal interconnection wire group from breaking because of inextensible stress generated by temperature cycling, and improve reliability of transmission between two adjacent chips.

In a possible design, pins are disposed on the lower surface of the first chip and the lower surface of the second chip, the pins include first pin groups and second pin groups, the first pin groups are configured to implement electrical connections between the metal redistribution wire group and the first chip and between the metal redistribution wire group and the second chip, and the second pin groups are configured to implement electrical connections between the metal interconnection wire group and the first chip and between the metal interconnection wire group and the second chip. The first pin groups and the second pin groups connect different objects but are the same in shape and process.

In a possible design, one end of the metal redistribution wire group is connected to the first pin groups of the first chip and the second chip, and the other end of the metal redistribution wire group is welded to the bump solder array, that is, the metal redistribution wire group passes through the main body of the redistribution structure in order to implement electrical connections between the first chip and the carrier and between the second chip and the carrier, and establish signal paths between the first chip and the carrier and between the second chip and the carrier.

In a possible design, one end of the metal interconnection wire group is connected to a second pin group of the first chip, and the other end of the metal interconnection wire group is connected to a second pin group of the second chip in order to implement electrical connections between the metal interconnection wire group and the first chip and between the metal interconnection wire group and the second chip, and establish a signal path between the first chip and the second chip using the metal interconnection wire group.

In a possible design, the metal interconnection wire group includes a first metal interconnection layer, a reference layer, and a second metal interconnection layer from top to bottom, the first metal interconnection layer and the second metal interconnection layer are used for signal transmission between the first chip and the second chip, that is, one is configured to transmit a signal, and the other is configured to receive a signal, and the reference layer is insulated from the first metal interconnection layer and the second metal interconnection layer in order to reduce interference between the first metal interconnection layer and the second metal interconnection layer, and improve stability of a signal between the first metal interconnection layer and the second metal interconnection layer.

In a possible design, the first metal interconnection layer, the reference layer, and the second metal interconnection layer are parallel to each other, that is, the three layers have a same bending radian or angle in order to ensure signal stability.

In a possible design, the package structure further includes a colloid, the colloid is configured to enclose other surfaces of the first chip that are different from the lower surface of the first chip and other surfaces of the second chip that are different from the lower surface of the second chip, and the colloid is configured to avoid interference of another component to the first chip and the second chip.

In a possible design, the colloid is further configured to fill a gap and a surrounding area of the bump solder array in order to alleviate stress on a bump of the redistribution structure.

In a possible design, the first chip and the second chip are dies or stack dies, and in a practical application, the package structure includes at least two dies, includes at least two stack dies, or includes at least one die and at least one stack die in order to expand an application scope of the embodiments of the present disclosure.

In a possible design, the curve design includes at least one arc or polyline in a horizontal direction of the main body of the redistribution structure, that is, the curve design includes at least one arc or a polyline when being viewed from the horizontal direction, the upper surface, or the lower surface of the main body of the redistribution structure, thereby improving reliability of transmission between two adjacent chips.

A second aspect of the embodiments of the present disclosure provides a signal transmission method based on a packaged chip, where the packaged chip is the packaged chip provided in the first aspect, and the method includes transmitting, by the first chip, a signal from the first chip to the second chip using the metal interconnection wire group.

In the second aspect of the embodiments of the present disclosure, signal transmission between two adjacent chips is implemented using the metal interconnection wire group in order to ensure a relatively short signal path. The metal interconnection wire group having the curve design is used to improve reliability of transmission between the two adjacent chips.

In the embodiments of the present disclosure, adjacent chips are connected by the metal interconnection wire group to ensure a relatively short signal path. The metal interconnection wire group having the curve design is used to prevent the metal interconnection wire group from breaking because of inextensible stress generated by temperature cycling, and improve reliability of transmission between two adjacent chips.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show merely some embodiments of the present disclosure, and persons of ordinary skill in the art may still derive other drawings from these accompanying drawings without creative efforts.

DESCRIPTION OF EMBODIMENTS

To resolve a problem of relatively poor reliability between two adjacent chips in a 2.5D FOP structure, an embodiment of the present disclosure provides a packaged chip. In the packaged chip, a metal interconnection wire group has a curve or bend design in order to prevent the metal interconnection wire group from breaking because of inextensible stress generated by temperature cycling, and improve reliability of transmission between two adjacent chips. The package structure includes at least two adjacent side-by-side chips. The package structure may be a 2.5D FOP structure, or may be a package structure combining a 2.5D FOP structure and a 3D FOP structure.

Figure 1:
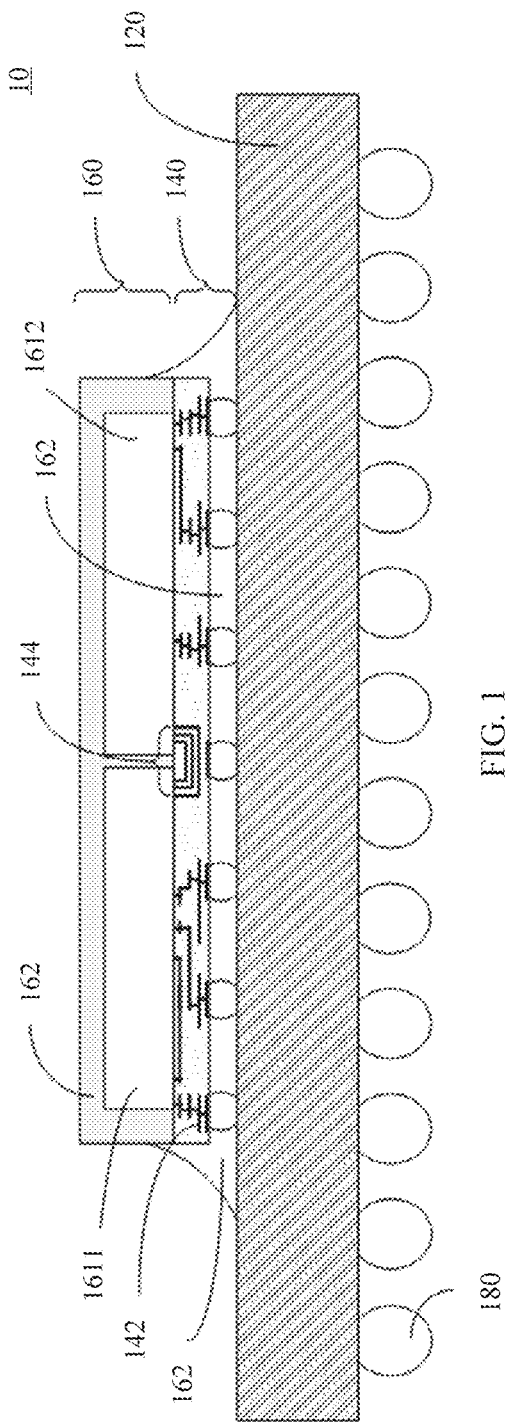
FIG. 1 is a cross sectional schematic view of a packaged chip according to an embodiment of the present disclosure.

Referring to FIG. 1, FIG. 1 is a cross sectional schematic view of a packaged chip 10 according to an embodiment of the present disclosure. The packaged chip 10 includes a carrier 120, a redistribution structure 140, and a package structure 160. The packaged chip 10 is described from top to bottom based on the cross sectional schematic view shown in FIG. 1.

The package structure 160 shown in FIG. 1 includes a first chip 1611 and a second chip 1612 adjacent to the first chip 1611. In a practical application, the package structure 160 includes at least two adjacent chips. The two chips 1611 and 1612 shown in FIG. 1 are only an example and do not impose a limitation on this embodiment of the present disclosure. Adjacency means location adjacency in a line, and may be front-and-back adjacency or left-and-right adjacency. A gap exists between the two adjacent chips 1611 and 1612 shown in FIG. 1. In the practical application, a gap may or may not exist between two adjacent chips.

The first chip 1611 and the second chip 1612 may be adjacent side by side. Side by side means being arranged in a line in no particular order, that is, any two chips are arranged in a line.

The first chip 1611 or the second chip 1612 may be a die, a stack die, a functional module including a stack die, or even a "chip" that has been packaged once. The die is a product form of a semiconductor component after manufacturing and before packaging, and usually exists in a wafer form or a die form. After being packaged, the die becomes a component of the semiconductor component, an integrated circuit, or a more complex circuit (such as a hybrid circuit). The stack die is a chip formed by multiple dies stacked together.

The at least two chips 1611 and 1612 in the package structure 160 may be homogeneous chips or heterogeneous chips. For example, an analog die and a digital die may be packaged together, dies manufactured at different wafer process nodes may be packaged together, or dies having different functions may be packaged together.

Pins are disposed on a lower surface of the first chip 1611 and a lower surface of the second chip 1612, and the pins include first pin groups and second pin groups. It should be noted that the first pin groups and the second pin groups connect different objects but are the same in shape and process.

Figure 2:
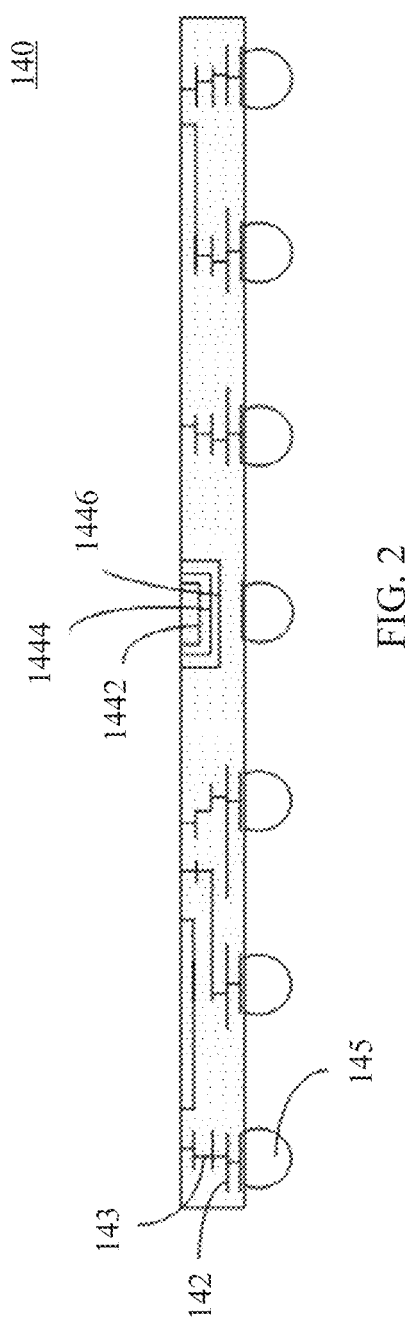
FIG. 2 is a cross sectional schematic view of a redistribution structure according to an embodiment of the present disclosure.
Figure 3:
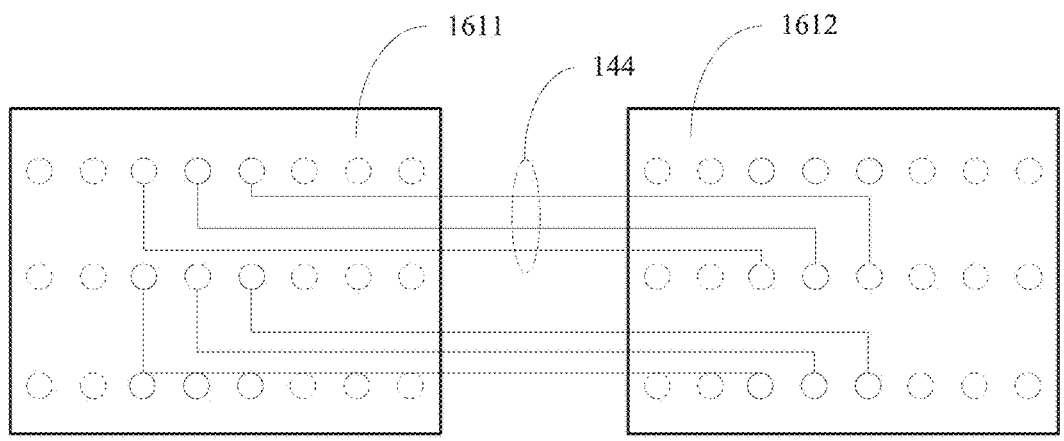
FIG. 3 is a top view of die pin interconnection using a metal interconnection wire group.

The redistribution structure 140 shown in FIG. 1 is configured to electronically connect the first chip 1611 and the carrier 120 and the second chip 1612 and the carrier 120. Referring to FIG. 2, FIG. 2 is a cross sectional schematic view of a redistribution structure 140 according to an embodiment of the present disclosure. The redistribution structure 140 includes a main body made of an insulating material and a bump solder array 145 welded to a lower surface of the main body. The main body of the redistribution structure 140 is the dotted portion in the cross sectional schematic view shown in FIG. 2.

An upper surface of the main body of the redistribution structure 140 adheres to the lower surface of the first chip 1611 and the lower surface of the second chip 1612. The bump solder array 145 of the redistribution structure 140 is welded to an upper surface of the carrier 120 such that the redistribution structure 140 is secured to the carrier 120.

A metal redistribution wire group is disposed in the main body. The metal redistribution wire group is electrically connected to the first chip 1611 and the second chip 1612, and the metal redistribution wire group is electrically connected to the carrier 120 using the bump solder array 145 such that the redistribution structure 140 electrically connects the first chip 1611 and the carrier 120, and electrically connects the second chip 1612 and the carrier 120. Further, the metal redistribution wire group is electrically connected to the first chip 1611 and the second chip 1612 using the first pin groups. The metal redistribution wire group passes through the main body. One end of the metal redistribution wire group is connected to the first pin groups of the first chip 1611 and the second chip 1612, the other end is welded to the bump solder array 145, and the bump solder array 145 is welded to the upper surface of the carrier 120 in order to implement electrical connections between the first chip 1611 and the carrier 120 and between the second chip 1612 and the carrier 120.

Based on the cross sectional schematic view shown in FIG. 2, the metal redistribution wire group includes at least one tree structure. That is, at least one tree structure is disposed in the main body. The following description uses one tree structure as an example. A tree structure includes metal RDLs 142 and plated through holes or blind holes 143. It should be noted that there is more than one metal RDL 142 and plated through hole or blind hole 143. Specific quantities are not limited herein. The metal RDLs 142 are parallel to the carrier 120 in a horizontal direction, and the plated through holes or blind holes 143 are perpendicular to the carrier 120 in the horizontal direction. Ports of the metal RDLs 142 are in the main body, and ports of the plated through holes or the blind holes 143 are in the main body or on a surface of the main body. The metal RDLs 142 arranged on a surface of the redistribution structure 140 or ports that are at one end of the plated through holes or blind holes 143 and on the surface of the redistribution structure 140 are attached to the first pin groups of the first chip 1611 and the second chip 1612. The plated through holes or blind holes 143 in the main body are configured to electrically connect adjacent metal RDLs 142.

A metal interconnection wire group 144 having a curve design is disposed in the main body. The metal interconnection wire group 144 is electrically connected to the first chip 1611 and the second chip 1612. Further, the metal interconnection wire group 144 is electrically connected to the first chip 1611 and the second chip 1612 using the second pin groups. One end of the metal interconnection wire group 144 is connected to a second pin group of the first chip 1611, and the other end of the metal interconnection wire group 144 is connected to a second pin group of the second chip 1612 in order to implement electrical connections between the metal interconnection wire group 144 and the first chip 1611 and between the metal interconnection wire group 144 and the second chip 1612.

It should be noted that if the first pin groups are configured to connect the metal redistribution wire group, the second pin groups are configured to connect the metal interconnection wire group 144. On the contrary, if the second pin groups are configured to connect the metal redistribution wire group, the first pin groups are configured to connect the metal interconnection wire group 144.

Based on the cross sectional schematic view shown in FIG. 2, the metal interconnection wire group 144 includes a first metal interconnection layer 1442, a reference layer 1444, and a second metal interconnection layer 1446 from top to bottom, and the layers are parallel to each other. The first metal interconnection layer 1442 and the second metal interconnection layer 1446 are used for signal transmission between the first chip 1611 and the second chip 1612. For example, the first chip 1611 transmits a signal to the second chip 1612 using the first metal interconnection layer 1442, and the second chip 1612 transmits a signal to the first chip 1611 using the second metal interconnection layer 1446. Alternatively, the first chip 1611 transmits a signal to the second chip 1612 using the second metal interconnection layer 1446, and the second chip 1612 transmits a signal to the first chip 1611 using the first metal interconnection layer 1442.

The metal interconnection wire group 144 provided in this embodiment of the present disclosure has the curve design. Being curved means being not straight. When being viewed from the upper surface or the lower surface of the main body of the redistribution structure 140, the curve design may be a curve or an "S" line having a radian, or may be a polyline having a bending angle. The bending angle may be an acute angle, an obtuse angle, or a right angle. For example, a portion that is of the metal interconnection wire group 144 and is parallel to the carrier 120 in the horizontal direction is not a shortest straight line design, but includes at least one arc or polyline. Referring to FIG. 4A to FIG. 4D. FIG. 4A to FIG. 4D are top views of die pin interconnection using a metal interconnection wire group according to an embodiment of the present disclosure. Small circles in FIG. 4A to FIG. 4D may be viewed as the pins of the first chip 1611 and the second chip 1612. The pins are configured to electrically connect the metal interconnection wire group 144. Dotted circles are not limited herein.

Figure 4A:
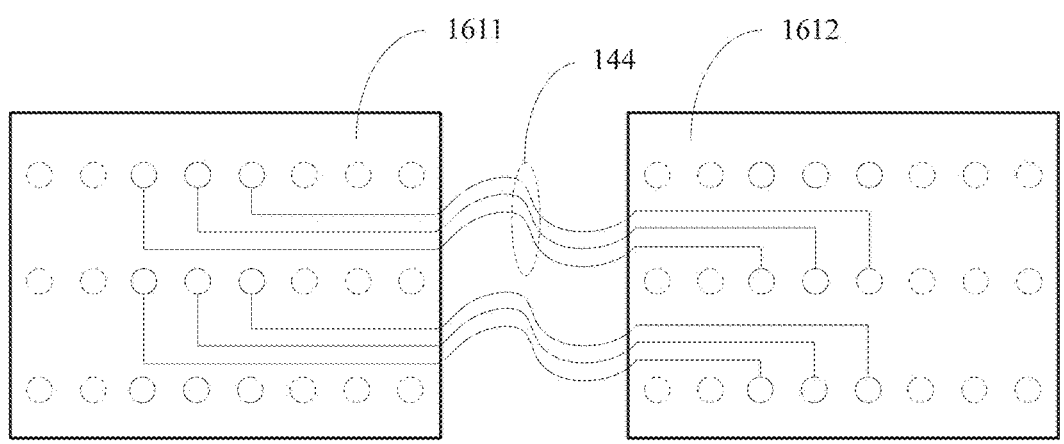
FIG. 4A is a top view of die pin interconnection using a metal interconnection wire group according to an embodiment of the present disclosure.
Figure 4B:
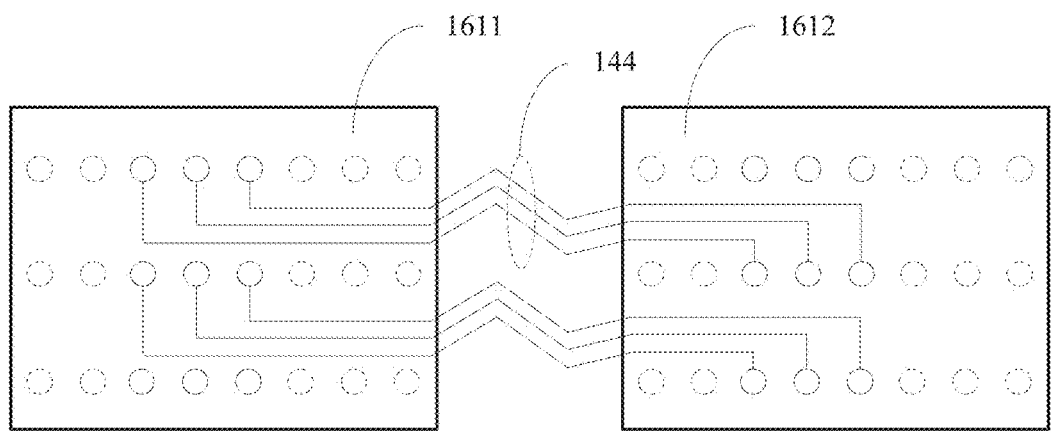
FIG. 4B is another top view of die pin interconnection using a metal interconnection wire group according to an embodiment of the present disclosure.
Figure 4C:
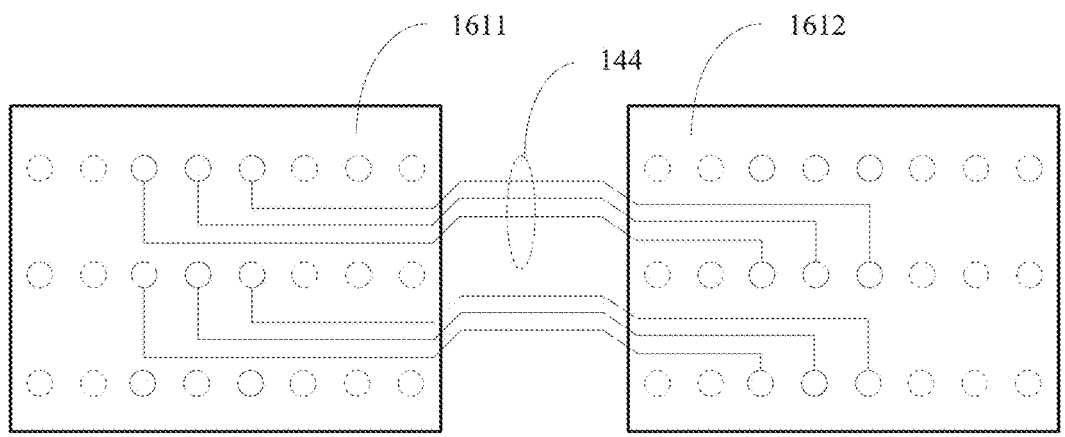
FIG. 4C is still another top view of die pin interconnection using a metal interconnection wire group according to an embodiment of the present disclosure.
Figure 4D:
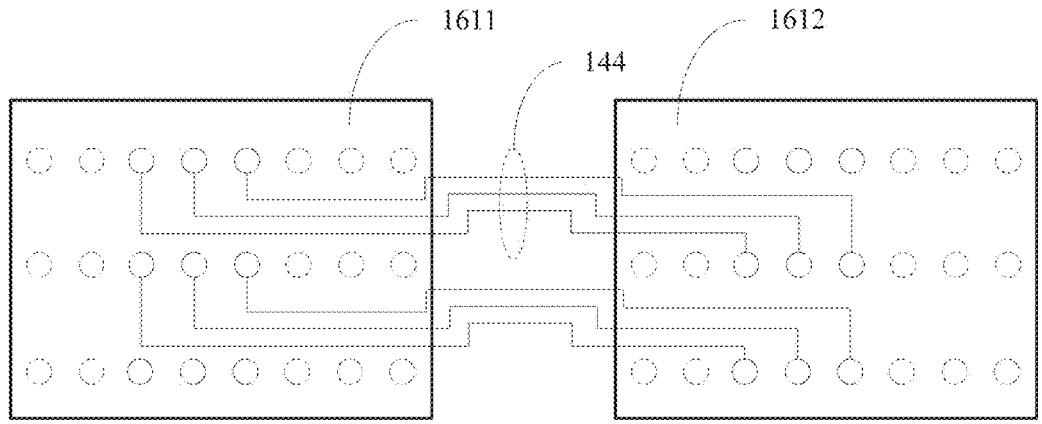
FIG. 4D is yet another top view of die pin interconnection using a metal interconnection wire group according to an embodiment of the present disclosure.

In FIG. 4A, the portion that is of the metal interconnection wire group 144 and is parallel to the carrier 120 in the horizontal direction includes at least one arc in order to prevent the metal interconnection wire group 144 from breaking because of inextensible stress generated by temperature cycling, and improve reliability of transmission between the two adjacent chips. In FIG. 4B, FIG. 4C, and FIG. 4D, the portion that is of the metal interconnection wire group 144 and is parallel to the carrier 120 in the horizontal direction includes at least one polyline in order to achieve a same effect as that in FIG. 4A. It should be noted that the metal interconnection wire group 144 may be alternatively designed to be a structure including an arc and a polyline.

The reference layer 1444 is insulated from the first metal interconnection layer 1442 and the second metal interconnection layer 1446, and is configured to isolate the first metal interconnection layer 1442 from the second metal interconnection layer 1446 in order to reduce interference between the first metal interconnection layer 1442 and the second metal interconnection layer 1446, and improve stability of a signal between the first metal interconnection layer 1442 and the second metal interconnection layer 1446. The reference layer 1444 may be a portion that is parallel to and overlaps with the first metal interconnection layer 1442 and the second metal interconnection layer 1446.

The carrier 120 shown in FIG. 1 may be a substrate configured to secure the redistribution structure 140. The bump solder array 145 secures the redistribution structure 140 to the carrier 120 in a tin soldering manner. A solder ball 180, a pad 180, or a connector 180 is disposed on a lower surface of the carrier 120 and is configured to electrically connect the carrier 120 and another component such as a printed circuit board (PCB).

The package structure 160 shown in FIG. 1 further includes a colloid 162. The colloid 162 encloses other surfaces of the first chip 1611 that are different from the lower surface of the first chip 1611 and other surfaces of the second chip 1612 that are different from the lower surface of the second chip 1612. In the practical application, the colloid 162 is configured to enclose other surfaces of any chip that are different from a surface adhering to the upper surface of the main body of the redistribution structure 140.

The colloid 162 is further configured to fill a gap or a surrounding area of the bump solder array 145 in order to alleviate stress on a bump of the redistribution structure 140. The stress means that interacting internal force is generated between parts of an object when the object deforms because of an external factor (such as force, humidity, or a temperature field change) in order to resist impact of the external factor, and attempt to restore the object from a position after deformation to a position before deformation.

An embodiment of the present disclosure provides a signal transmission method based on a packaged chip. The method is applied to a packaged chip, such as a packaged chip 10 shown in FIG. 1. The packaged chip includes a carrier, a redistribution structure, and a package structure. The package structure includes a first chip and a second chip adjacent to the first chip. The redistribution structure is configured to electrically connect the first chip and the carrier, and is configured to electrically connect the second chip and the carrier. The redistribution structure includes a main body made of an insulating material and a bump solder array welded to a lower surface of the main body. A metal redistribution wire group is disposed in the main body. The metal redistribution wire group is electrically connected to the first chip and the second chip, and the metal redistribution wire group is electrically connected to the carrier using the bump solder array. A metal interconnection wire group having a curve design is disposed in the main body. The metal interconnection wire group is electrically connected to the first chip and the second chip. The carrier is configured to secure the redistribution structure. A solder ball, a pad, or a connector is disposed on a lower surface of the carrier. An upper surface of the main body of the redistribution structure adheres to a lower surface of the first chip and a lower surface of the second chip. The bump solder array of the redistribution structure is welded to an upper surface of the carrier.

The method includes transmitting, by the first chip, a signal from the first chip to the second chip using the metal interconnection wire group.

The signal may be a signal received by the first chip from another chip, or may be a signal generated by the first chip. The signal may carry content such as an instruction or data. The second chip may also transmit a signal from the second chip to the first chip using the metal interconnection wire group. Further, the first chip transmits the signal from the first chip to the second chip using the first metal interconnection layer, and the second chip transmits the signal from the second chip to the first chip using the second metal interconnection layer. Alternatively, the first chip transmits the signal from the first chip to the second chip using the second metal interconnection layer, and the second chip transmits the signal from the second chip to the first chip using the first metal interconnection layer. In other words, for the first chip, if the first metal interconnection layer is a transmit channel, the second metal interconnection layer is a receive channel. In this case, for the second chip, the first metal interconnection layer is a receive channel, and the second metal interconnection layer is a transmit channel. On the contrary, for the first chip, if the second metal interconnection layer is the receive channel, the first metal interconnection layer is the transmit channel. In this case, for the second chip, the first metal interconnection layer is the transmit channel, and the second metal interconnection layer is the receive channel.

In this embodiment of the present disclosure, a signal is transmitted between two chips using the metal interconnection wire group, and the signal does not need to pass through the redistribution structure and be forwarded by the carrier. Therefore, a relatively short signal path can be ensured. The metal interconnection wire group having the curve design is used to prevent the metal interconnection wire group from breaking because of inextensible stress generated by temperature cycling, and improve reliability between two adjacent chips.

Figure 5:
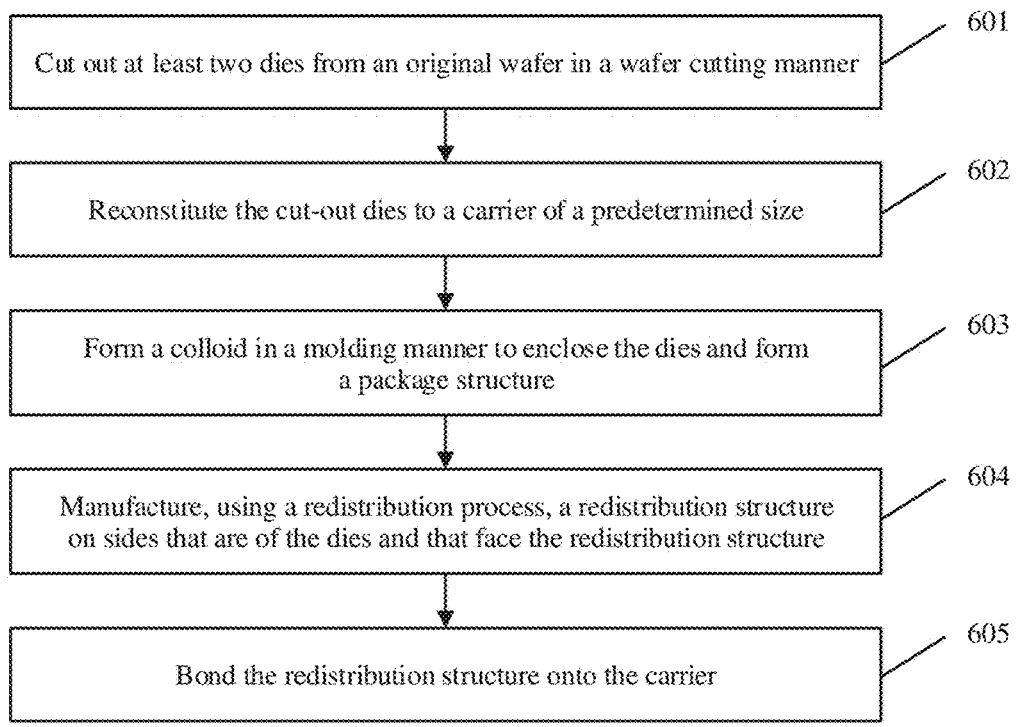
FIG. 5 is a schematic flowchart of manufacturing a packaged chip according to an embodiment of the present disclosure.

Referring to FIG. 5, FIG. 5 is a schematic flowchart of manufacturing a packaged chip according to an embodiment of the present disclosure. A manufacturing procedure may include the following steps.

Step 601: Cut out at least two dies from an original wafer in a wafer cutting manner.

Step 602: Reconstitute the cut-out dies to a carrier of a predetermined size.

It should be noted that a distance between the dies may affect performance of high-density interconnection between the dies. If the process permits, the distance between the dies needs to be reduced as much as possible, for example, less than 50 micrometers (μm).

Step 603: Form a colloid in a molding manner to enclose the dies and form a package structure.

After the colloid encloses the dies, sides that are of the dies and that face a redistribution structure need to be exposed using a specific process method, for example, using a grinding method, or using a temporary carrier to cover corresponding positions of the dies in a molding process, and then directly removing the temporary carrier after the enclosure is completed.

Step 604: Manufacture, using a redistribution process, a redistribution structure on sides that are of the dies and that face the redistribution structure.

A medium of a main body of the redistribution structure may be an insulating and exposure photo-imageable organic medium, such as polyimide (PI), poly-p-phenylenebenzo-bisthiazole (PBO), or epoxy based polymer (EBP). A metal RDL and a metal interconnection layer may be manufactured using a process, such as sputtering or electroplating, on the basis of the medium of the main body, and may use copper as a material. A minimum wire width and a minimum wire distance on a metal layer may be from 2 μm/2 μm to 1 μm/1 μm, or smaller values. Copper-plated holes (plated through holes or blind holes) may be prepared on the medium of the main body in order to implement interconnection between different metal RDLs. Diameters of a via and a via land of a copper-plated hole may be respectively 5 μm and 10 μm or smaller values.

Step 605: Bond the redistribution structure onto the carrier.

After the dies, the colloid, and the redistribution structure are prepared, the redistribution structure may be bonded onto the carrier (substrate) in a manner such as mass reflow or thermo compression bonding. Underfill may be applied between the redistribution structure and the substrate as required in order to alleviate stress on a bump of the redistribution structure, and improve package reliability. The carrier may be a multi-layer substrate, and signal exchange between layers is implemented in a laser drill or mechanical drill and copper plating manner or another manner. A solder ball is disposed at the bottom of the carrier, and the carrier is connected to a PCB using the solder ball. In another implementation, the bottom of the substrate may also be connected to the PCB in a pluggable socket manner.

The foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A packaged chip, comprising:
   a redistrubtion layer; and
   a package structure comprising a first chip and a second chip adjacent to the first chip;
   wherein the first chip and the second chip are disposed on the redistribution layer,
   wherein the redistribution layer comprises a main body made of an insulating material and a bump solder array welded to a lower surface of the main body,
   wherein the redistribution layer further comprises a metal interconnection wire group having a metal interconnection wire disposed in the main body,
   wherein two ends of the metal interconnect wire are respectively coupled to the first chip and the second chip, and
   wherein the metal interconnect wire has a curve design at a body thereof.

2. The packaged chip of claim 1, wherein the redistribution layer further comprises a metal redistribution wire group disposed in the main body, wherein pins are disposed on the lower surface of the first chip and the lower surface of the second chip, wherein the pins comprise first pin groups and second pin groups, wherein the first pin groups are configured to implement electrical couplings between the metal redistribution wire group and the first chip and between the metal redistribution wire group and the second chip, and wherein the second pin groups are configured to implement electrical couplings between the metal interconnection wire group and the first chip and between the metal interconnection wire group and the second chip.

3. The packaged chip of claim 2, wherein one end of the metal redistribution wire group is coupled to first pin groups of the first chip and the second chip, wherein the other end of the metal redistribution wire group is welded to the bump solder array, and wherein the metal redistribution wire group is configured to implement electrical couplings between the first chip and the bump solder array and between the second chip and the bump solder array.

4. The packaged chip of claim 2, wherein one end of the metal interconnection wire group is coupled to a second pin group of the first chip, and wherein the other end of the metal interconnection wire group is coupled to a second pin group of the second chip in order to implement electrical couplings between the metal interconnection wire group and the first chip and between the metal interconnection wire group and the second chip.

5. The packaged chip of claim 4, wherein the metal interconnection wire group comprises a first metal interconnection layer, a reference layer, and a second metal interconnection layer from top to bottom, wherein metal interconnection wires are disposed on the first metal interconnection layer and the second metal interconnection layer are used for signal transmission between the first chip and the second chip, wherein the reference layer is insulated from the first metal interconnection layer and the second metal interconnection layer, and wherein the reference layer is configured to isolate the first metal interconnection layer from the second metal interconnection layer.

6. The packaged chip of claim 1, wherein the package structure further comprises a colloid, and wherein the colloid is configured to enclose other surfaces of the first chip that are different from the lower surface of the first chip and other surfaces of the second chip that are different from the lower surface of the second chip.

7. The packaged chip of claim 6, wherein the colloid is further configured to fill a gap and a surrounding area of the bump solder array.

8. The packaged chip of claim 1, wherein the first chip and the second chip are dies.

9. The packaged chip of claim 1, wherein the first chip and the second chip are stack dies.

10. The packaged chip of claim 1, wherein the curve design comprises at least one arc.

11. The packaged chip of claim 1, wherein the curve design comprises polyline in a horizontal direction of the main body of the redistribution layer.

12. The packaged chip of claim 1, wherein the first chip transmits a signal from the first chip to the second chip using the metal interconnection wire group.

13. An electrical device comprising:
a carrier; and
a packaged chip disposed on the carrier,
wherein the packaged chip is electrically coupled with electrical components disposed on the carrier through a bump solder array, and
wherein the packaged chip comprises:
a redistribution layer; and
a package structure comprising a first chip and a second chip adjacent to the first chip;
wherein the first chip and the second chip are disposed on the redistribution layer,
wherein the redistribution layer comprises a main body made of an insulating material and the bump solder array welded to a lower surface of the main body,
wherein the redistribution layer further comprises a metal interconnection wire group having a metal interconnection wire disposed in the main body,
wherein two ends of the metal interconnect wire are respectively coupled to the first chip and the second chip, and
wherein the metal interconnect wire has a curve design at a body thereof.

14. The electrical device of claim 13, wherein the first chip and the second chip are dies.

15. The electrical device of claim 13, wherein the first chip and the second chip are stack dies.

16. The electrical device of claim 13, wherein the curve design comprises at least one arc.

17. The electrical device of claim 13, wherein the curve design comprises polyline in a horizontal direction of the main body of the redistribution structure.

18. The electrical device of claim 13, wherein the first chip transmits a signal from the first chip to the second chip using the metal interconnection wire group.

* * * * *